(12) United States Patent
Masleid

(10) Patent No.: US 8,587,344 B2
(45) Date of Patent: Nov. 19, 2013

(54) POWER EFFICIENT MULTIPLEXER

(76) Inventor: Robert Paul Masleid, Monte Sereno, CA (US)

(*) Notice: Subject to any disclaimer, the term of this patent is extended or adjusted under 35 U.S.C. 154(b) by 0 days.

(21) Appl. No.: 13/356,396

(22) Filed: Jan. 23, 2012

(65) Prior Publication Data

US 2012/0242371 A1   Sep. 27, 2012

Related U.S. Application Data

(63) Continuation of application No. 12/397,085, filed on Mar. 3, 2009, now Pat. No. 8,102,190, which is a continuation of application No. 11/021,632, filed on Dec. 23, 2004, now Pat. No. 7,498,846, which is a continuation-in-part of application No. 10/864,271, filed on Jun. 8, 2004, now Pat. No. 7,336,103.

(51) Int. Cl.
   *H03K 19/094*   (2006.01)
   *H03K 19/20*   (2006.01)

(52) U.S. Cl.
   USPC ........................... 326/113; 326/119; 327/408

(58) Field of Classification Search
   USPC ............ 326/83, 113, 119, 121, 122; 327/415, 327/416, 407, 410
   See application file for complete search history.

(56) References Cited

U.S. PATENT DOCUMENTS

| | | |
|---|---|---|
| 3,900,747 A | 8/1975 | Yamazaki et al. |
| 3,991,380 A | 11/1976 | Pryor |
| 4,087,044 A | 5/1978 | Hofmann |
| 4,216,390 A | 8/1980 | Stewart |
| 4,437,024 A | 3/1984 | Wacyk |
| 4,498,021 A | 2/1985 | Uya |
| 4,508,983 A | 4/1985 | Allgood et al. |
| 4,568,842 A | 2/1986 | Koike |
| 4,578,600 A | 3/1986 | Magee |
| 4,651,030 A | 3/1987 | Mimoto |
| 4,700,089 A | 10/1987 | Fujii et al. |
| 4,739,252 A | 4/1988 | Malaviya et al. |
| 4,760,279 A | 7/1988 | Saito et al. |
| 4,806,804 A | 2/1989 | O'Leary |
| 4,808,802 A | 2/1989 | Kano |
| 4,947,064 A | 8/1990 | Kim et al. |
| 5,039,893 A | 8/1991 | Tomisawa |
| 5,128,560 A | 7/1992 | Chern et al. |
| 5,166,555 A | 11/1992 | Kano |

(Continued)

FOREIGN PATENT DOCUMENTS

| | | |
|---|---|---|
| EP | 1398639 | 3/2004 |
| JP | 03089624 | 4/1991 |
| JP | 04091516 | 3/1992 |
| JP | 06216723 | 8/1994 |

OTHER PUBLICATIONS

Chen, G et al., "Dynamic NBTI of p-MOS Transistors and its Impact on MOSFET Scaling" IEEE Electron Device Letters, Dec. 2002, pp. 1-3.

(Continued)

*Primary Examiner* — Daniel D Chang

(57) ABSTRACT

A power efficient multiplexer. In accordance with a first embodiment, a power efficient multiplexer comprises a transmission gate structure for selectively passing one of a plurality of input signals and a stacked inverter circuit for inverting the one of a plurality of input signals. Both the stacked inverter and the transmission gate provide beneficial reductions in static power consumption in comparison to conventional multiplexer designs.

13 Claims, 2 Drawing Sheets

(56) References Cited

U.S. PATENT DOCUMENTS

| | | |
|---|---|---|
| 5,227,679 A | 7/1993 | Woo |
| 5,264,738 A | 11/1993 | Veendrick et al. |
| 5,294,845 A | 3/1994 | McMahan et al. |
| 5,297,086 A | 3/1994 | Nasu et al. |
| 5,399,925 A | 3/1995 | Nguyen |
| 5,410,278 A | 4/1995 | Itoh et al. |
| 5,414,312 A | 5/1995 | Wong |
| 5,455,521 A | 10/1995 | Dobbelaere |
| 5,467,038 A | 11/1995 | Motley et al. |
| 5,497,105 A | 3/1996 | Oh et al. |
| 5,525,616 A | 6/1996 | Platt et al. |
| 5,568,103 A | 10/1996 | Nakashima et al. |
| 5,587,665 A | 12/1996 | Jiang |
| 5,594,360 A | 1/1997 | Wojciechowski |
| 5,610,548 A | 3/1997 | Masleid |
| 5,614,845 A | 3/1997 | Masleid |
| 5,656,963 A | 8/1997 | Masleid et al. |
| 5,677,650 A | 10/1997 | Kwasniewski et al. |
| 5,680,359 A | 10/1997 | Jeong |
| 5,698,994 A | 12/1997 | Tsuji |
| 5,739,715 A | 4/1998 | Rawson |
| 5,764,110 A | 6/1998 | Ishibashi |
| 5,767,700 A | 6/1998 | Lee |
| 5,777,501 A | 7/1998 | AbouSeido |
| 5,778,214 A | 7/1998 | Taya et al. |
| 5,791,715 A | 8/1998 | Nebel |
| 5,793,715 A | 8/1998 | Alon et al. |
| 5,796,313 A | 8/1998 | Eitan |
| 5,797,105 A | 8/1998 | Nakaya et al. |
| 5,811,983 A | 9/1998 | Lundberg |
| 5,877,632 A | 3/1999 | Goetting et al. |
| 5,880,608 A | 3/1999 | Mehta et al. |
| 5,894,419 A | 4/1999 | Galambos et al. |
| 5,926,050 A | 7/1999 | Proebsting |
| 5,963,043 A | 10/1999 | Nassif |
| 5,963,074 A | 10/1999 | Arkin |
| 5,969,543 A | 10/1999 | Erickson et al. |
| 5,977,763 A | 11/1999 | Loughmiller et al. |
| 5,982,211 A | 11/1999 | Ko |
| 6,011,403 A | 1/2000 | Gillette |
| 6,025,738 A | 2/2000 | Masleid |
| 6,028,490 A | 2/2000 | Komatsu |
| 6,031,403 A | 2/2000 | Gersbach |
| 6,069,506 A | 5/2000 | Miller, Jr. et al. |
| 6,087,886 A | 7/2000 | Ko |
| 6,111,447 A | 8/2000 | Ternullo, Jr. |
| 6,114,840 A | 9/2000 | Farrell et al. |
| 6,127,872 A | 10/2000 | Kumata |
| 6,154,099 A | 11/2000 | Suzuki et al. |
| 6,154,100 A | 11/2000 | Okamoto |
| 6,160,755 A | 12/2000 | Norman et al. |
| 6,172,545 B1 * | 1/2001 | Ishii .................... 327/276 |
| 6,172,943 B1 | 1/2001 | Yuzuki |
| 6,188,260 B1 | 2/2001 | Stotz et al. |
| 6,198,334 B1 | 3/2001 | Tomobe et al. |
| 6,204,710 B1 | 3/2001 | Goetting et al. |
| 6,229,747 B1 | 5/2001 | Cho et al. |
| 6,242,936 B1 | 6/2001 | Ho et al. |
| 6,242,937 B1 | 6/2001 | Lee et al. |
| 6,262,601 B1 | 7/2001 | Choe et al. |
| 6,275,091 B1 | 8/2001 | Saeki |
| 6,281,706 B1 | 8/2001 | Wert et al. |
| 6,285,230 B1 | 9/2001 | Na |
| 6,294,930 B1 | 9/2001 | Goetting et al. |
| 6,321,282 B1 | 11/2001 | Horowitz et al. |
| 6,323,706 B1 | 11/2001 | Stark et al. |
| 6,366,115 B1 | 4/2002 | DiTommaso |
| 6,407,571 B1 | 6/2002 | Furuya et al. |
| 6,426,641 B1 | 7/2002 | Koch et al. |
| 6,426,652 B1 | 7/2002 | Greenhill et al. |
| 6,455,901 B2 | 9/2002 | Kameyama et al. |
| 6,459,319 B2 | 10/2002 | Sako |
| 6,466,063 B2 | 10/2002 | Chen |
| 6,476,632 B1 | 11/2002 | La Rosa et al. |
| 6,489,796 B2 | 12/2002 | Tomishima |
| 6,535,014 B2 | 3/2003 | Chetlur et al. |
| 6,538,471 B1 | 3/2003 | Stan et al. |
| 6,538,522 B1 | 3/2003 | Aipperspach et al. |
| 6,545,519 B1 | 4/2003 | Carballo |
| 6,570,407 B1 | 5/2003 | Sugisawa et al. |
| 6,573,774 B1 | 6/2003 | Gardner |
| 6,573,777 B2 | 6/2003 | Saint-Laurent et al. |
| 6,577,157 B1 | 6/2003 | Cheung et al. |
| 6,577,176 B1 | 6/2003 | Masleid et al. |
| 6,621,318 B1 | 9/2003 | Burr |
| 6,657,504 B1 | 12/2003 | Deal et al. |
| 6,664,837 B1 | 12/2003 | Oh et al. |
| 6,690,242 B2 | 2/2004 | Fang et al. |
| 6,697,929 B1 | 2/2004 | Cherkauer et al. |
| 6,724,214 B2 | 4/2004 | Manna et al. |
| 6,731,140 B2 | 5/2004 | Masleid et al. |
| 6,731,179 B2 | 5/2004 | Abadeer et al. |
| 6,759,863 B2 | 7/2004 | Moore |
| 6,762,638 B2 | 7/2004 | Correale, Jr. et al. |
| 6,762,966 B1 | 7/2004 | LaRosa et al. |
| 6,768,363 B2 | 7/2004 | Yoo et al. |
| 6,774,734 B2 | 8/2004 | Christensen et al. |
| 6,798,230 B1 | 9/2004 | Taylor et al. |
| 6,815,971 B2 | 11/2004 | Wang et al. |
| 6,815,977 B2 | 11/2004 | Sabbavarapu et al. |
| 6,831,494 B1 | 12/2004 | Fu et al. |
| 6,879,200 B2 | 4/2005 | Komura et al. |
| 6,882,172 B1 | 4/2005 | Suzuki et al. |
| 6,885,210 B1 | 4/2005 | Suzuki |
| 6,903,564 B1 | 6/2005 | Suzuki |
| 6,924,669 B2 | 8/2005 | Itoh et al. |
| 7,053,660 B2 | 5/2006 | Itoh et al. |
| 7,053,680 B2 | 5/2006 | Masleid et al. |
| 7,119,580 B2 | 10/2006 | Masleid et al. |
| 7,142,018 B2 | 11/2006 | Masleid et al. |
| 7,172,638 B2 | 2/2007 | Robb |
| 7,173,455 B2 | 2/2007 | Masleid et al. |
| 7,239,170 B2 | 7/2007 | Suen et al. |
| 7,245,159 B2 | 7/2007 | Dhong et al. |
| 7,271,638 B2 | 9/2007 | Takai et al. |
| 7,282,958 B2 | 10/2007 | Rhee |
| 7,295,041 B1 | 11/2007 | Masleid et al. |
| 7,304,503 B2 | 12/2007 | Masleid et al. |
| 7,336,103 B1 | 2/2008 | Masleid et al. |
| 7,525,341 B1 * | 4/2009 | Rosen et al. .................... 326/38 |
| 7,808,271 B2 | 10/2010 | Rosen et al. |
| 2001/0000426 A1 | 4/2001 | Sung et al. |
| 2001/0028278 A1 | 10/2001 | Ooishi |
| 2001/0030561 A1 | 10/2001 | Asano et al. |
| 2001/0052623 A1 | 12/2001 | Kameyama et al. |
| 2002/0056016 A1 | 5/2002 | Horowitz et al. |
| 2002/0178415 A1 | 11/2002 | Saraf |
| 2003/0005775 A1 | 1/2003 | Washeleski et al. |
| 2003/0011413 A1 | 1/2003 | Masleid |
| 2003/0042960 A1 | 3/2003 | Gomm |
| 2003/0057775 A1 | 3/2003 | Yamashita et al. |
| 2003/0160630 A1 | 8/2003 | Earle |
| 2003/0189465 A1 | 10/2003 | Abadeer et al. |
| 2003/0231713 A1 | 12/2003 | Masleid et al. |
| 2004/0104731 A1 | 6/2004 | Vollertsen |
| 2004/0119501 A1 | 6/2004 | Sabbavarapu et al. |
| 2004/0119503 A1 | 6/2004 | Jamshidi et al. |
| 2004/0124900 A1 | 7/2004 | Brox |
| 2004/0148111 A1 | 7/2004 | Gauthier et al. |
| 2004/0257115 A1 | 12/2004 | Bertram et al. |
| 2005/0184720 A1 | 8/2005 | Bernstein et al. |
| 2005/0212547 A1 | 9/2005 | Suzuki |
| 2005/0248368 A1 | 11/2005 | Bertram et al. |

OTHER PUBLICATIONS

Lima T., et al.; "Capacitance Coupling Immune, Transient Sensitive Accelerator for Resistive interconnect signals of subquater micron ULSI", IEEE Journal of Solid-State Circuits, IEEE Inc., New York, US, vol. 31, No. 4, Apr. 1996, pp. 531-536.

Nalamalpu, et al., "Boosters for Driving Long Onchip Interconnects—Design Issues, Interconnect Synthesis, and Comparison with Repeaters", Jan. 2002, IEEE Transactions on Computer-Aided

(56) References Cited

OTHER PUBLICATIONS

Design of Integrated Circuits and Systems, vol. 21, No. 1, Jan. 2002, pp. 50-62.

Oner et al., "A compact Monitoring Circuit for Real-Time On-Chip Diagnosis of Hot-Carrier Induced Degradation" Microelectronic test structures. Proceedings, IEEE International Conference in Monterey, Ca. Mar. 17, 1997-Mar. 20, 1997, pp. 72-76.

Peters, Laura. "NBTI: A Growing Threat to Device Reliability," Semiconductor International. Mar. 1, 2004 Http://www.reed-electronics.com/semiconductor/article/CA386329?industryid=3033.

Reddy. V. et al., "Impact of Negative Bias Temperature Instability on Digital Circuit Reliability". 2002 IEE International Reliability Physics Symposium Proceedings, Dallas TX Apr. 7, 2002-Apr. 11, 2002, pp. 248-254.

Rhyne, "Fundamentals of Digital Systems Design", N.J., Jan. 1973, pp. 70-71.

Ryohei Kaneda, Translation of Japanese Kokai Patent Application No. HEI 3[1991]-89624, publication date: Apr. 15, 1991, pp. 1-6.

Stojanovic, V. and Oklobdzija, V., "Comparative Analysis of Master-Slave Latches and Flip-Flops for High-Performance and Low-Power Systems", IEEE Journal of Solid-State Circuits, vol. 34, No. 4, Apr. 1999, pp. 536-548.

Taub, et al., Digital Integrated Electronics, Jan. 1977, McGraw-Hill, Inc. pp. 98-100.

* cited by examiner

POWER EFFICIENT MULTIPLEXER

CROSS-REFERENCE TO RELATED APPLICATIONS

This application is a Continuation of and claims priority to U.S. patent application Ser. No. 12/397,085, filed on Mar. 3, 2009, which is a Continuation of and claims priority to U.S. patent application Ser. No. 11/021,632, filed on Dec. 23, 2004 and now issued as U.S. Pat. No. 7,498,846, which is a Continuation-In-Part of and claims priority to U.S. patent application Ser. No. 10/864,271, filed on Jun. 8, 2004 and now issued as U.S. Pat. No. 7,336,103, which are hereby incorporated by reference in their entirety.

This application is related to the following commonly assigned United States patent applications, which are hereby incorporated herein by reference in their entirety:

U.S. patent application Ser. No. 11/021,222, filed Dec. 23, 2004, now U.S. Pat. No. 7,635,992, entitled "A Configurable Tapered Delay Chain with Multiple Sizes of Delay Elements" by Masleid;

U.S. patent application Ser. No. 11/021,221, filed Dec. 23, 2004, now U.S. Pat. No. 7,656,212, entitled "A Configurable Delay Chain with Switching Control for Tail Delay Elements" by Masleid;

U.S. patent application Ser. No. 11/021,197, filed Dec. 23, 2004, now U.S. Pat. No. 7,332,931, entitled "Leakage Efficient Anti-glitch Filter with Variable Delay Stages" by Masleid;

U.S. patent application Ser. No. 11/020,746, filed Dec. 23, 2004, now U.S. Pat. No. 7,310,008, entitled "A Configurable Delay Chain with Stacked Inverter Delay Elements" by Masleid; and U.S. patent application Ser. No. 11/021,633, filed Dec. 23, 2004, now U.S. Pat. No. 7,330,054, entitled "Leakage Efficient Anti-glitch Filter" by Masleid.

FIELD

Embodiments relate to power efficient multiplexers.

BACKGROUND

Static power consumption in modern semiconductor processes, e.g., processes with a minimum feature size of about 0.13 microns and smaller, is no longer a negligible component of total power consumption. For such processes, static power may be one-half of total power consumption. Further, static power, as a percentage of total power, is tending to increase with successive generations of semiconductor process. Consequently, circuit elements that are efficient in terms of static power consumption are highly desired. One commonly utilized circuit element is a multiplexer. In general, a multiplexer selects among several inputs to propagate to its output. For example, variable delay circuits generally require a series of multiplexers to select between a signal present at a desired tap of the delay circuit and a signal propagating from beyond a desired tap.

SUMMARY

A power efficient multiplexer is disclosed. In accordance with a first embodiment, a power efficient multiplexer comprises a transmission gate structure for selectively passing one of a plurality of input signals and a stacked inverter circuit for inverting the one of a plurality of input signals.

In accordance with another embodiment, the plurality of electronic signals is accessed. A method of selecting one electronic signal from a plurality of electronic signals is disclosed. A plurality of transmission gates is configured to select one electronic signal from the plurality of electronic signals. The one electronic signal is inverted utilizing a stacked inverter circuit. In accordance with still another embodiment, an electronic circuit comprises a stacked inverter circuit. The stacked inverter circuit comprises at least two devices of a first type coupled in series. These devices are coupled in series to a group of at least two devices of an opposite type coupled in series. The electronic circuit further comprises a first conductance terminal of a first transmission gate coupled to a first electronic signal and a first conductance terminal of a second transmission gate coupled to a second electronic signal.

The second conductance terminals of the first and second transmission gates are coupled to an input of the stacked inverter circuit. The first control terminal of a semiconductor type of the first transmission gate is coupled to a second control terminal of opposite semiconductor type of the second transmission gate. The second control terminal of the opposite semiconductor type of the first transmission gate is coupled to a first control terminal of the semiconductor type of the second transmission gate.

BRIEF DESCRIPTION OF THE DRAWINGS

The accompanying drawings, which are incorporated in and form a part of this specification, illustrate embodiments, together with the description, serve to explain the principles of the disclosure.

DETAILED DESCRIPTION

Reference will now be made in detail to embodiments, examples of which are illustrated in the accompanying drawings. While the disclosure will be described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description, numerous specific details are set forth in order to provide a thorough understanding. However, it will be recognized by one of ordinary skill in the art that embodiments may be practiced without these specific details.

Power Efficient Multiplexer

Embodiments are described in the context of design and operation of integrated semiconductors. More particularly, embodiments relate to power efficient multiplexers. It is appreciated, however, that embodiments may be utilized in other areas of semiconductor design and operation.

The following description of embodiments is directed toward pFETs (or p-type metal oxide semiconductor field effect transistors (MOSFETS)) formed in surface N-wells and/or nFETs (or n-type MOSFETS) formed in surface P-wells when a p-type substrate and an N-well process are utilized. It is to be appreciated, however, that embodiments are equally applicable to nFETs (or n-type MOSFETS) formed in surface P-wells and/or pFETs (or p-type MOS- FETS) formed in surface N-wells when an n-type substrate and a P-well process are utilized. Consequently, embodiments are well suited to semiconductors formed in both p-type and n-type materials, and such embodiments are considered within the scope of the disclosure.

Figure 1:
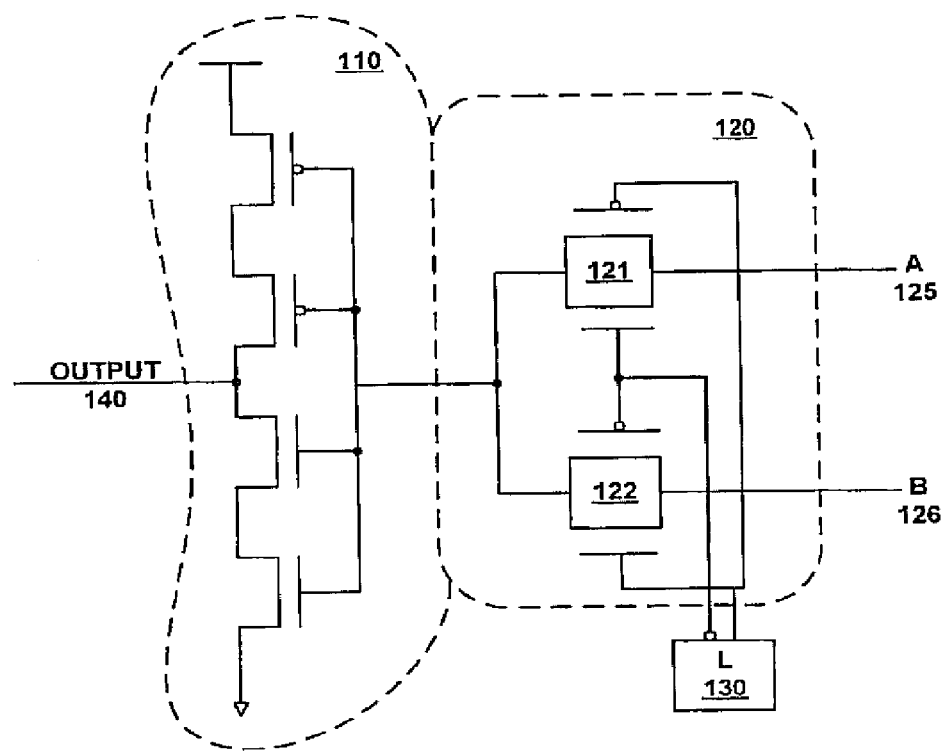
FIG. 1 illustrates a schematic of a novel power efficient multiplexer, in accordance with embodiments.

FIG. 1 illustrates a schematic of a novel power efficient multiplexer 100, in accordance with embodiments. Power efficient multiplexer 100 comprises an inverter 110 and a transmission gate structure 120. Transmission gate structure 120 comprises transmission gates 121 and 122.

A bit value in latch 130 determines whether transmission gate 121 is "open" or "closed," for example whether transmission gate 121 passes a signal or not. Similarly, the bit value in latch 130 determines whether transmission gate 122 passes a signal or not. Both transmission gates 121 and 122 are controlled by the same bit value and that bit value's complement. Consequently, either transmission gate 122 will pass a signal, or transmission gate 121 will pass a signal, but not both simultaneously.

For example, in the embodiment of FIG. 1, a zero value in latch 130 will cause transmission gate 121 to pass signal A 125, while causing transmission gate 122 not to pass any signals. Consequently, transmission gate structure 120 will select signal A 125 corresponding to a zero value in latch 130.

Similarly, a one value in latch 130 will cause transmission gate 122 to pass signal B 126, while causing transmission gate 121 not to pass any signals. Consequently, transmission gate structure 120 will select signal B 126 corresponding to a one value in latch 130.

The signal, A 125 or B 126, selected by transmission gate structure 120 is inverted by inverter 110 to produce output 140 of power efficient multiplexer 100.

It is to be appreciated that static power consumption in modern semiconductor processes, e.g., processes with a minimum feature size of about 0.13 microns and smaller, is no longer a negligible component of total power consumption. For such processes, static power may be one-half of total power consumption. Further, static power, as a percentage of total power, is tending to increase with successive generations of semiconductor process.

Advantageously, inverter 110 comprises stacked field effect transistors (FETs). In general, an inverter stage, whether conventional or stacked, forms a leakage path, e.g., a series "string" of devices coupled from operating voltage (Vdd) to ground. As current leaks through such leakage paths, static power is consumed by the inverter stage. As described more completely in U.S. patent application Ser. No. 10/864,271, entitled "Stacked Inverter Delay Chain" to Masleid and Burr, incorporated herein by reference in its entirety, an inverter comprising stacked field effect transistors can consume less static power than a conventional inverter to produce a comparable delay.

Further, such leakage paths within a stacked inverter suffer less leakage than a conventional inverter, yielding additional beneficial leakage reductions. In a conventional inverter, exactly one transistor is on while the other transistor is off.

As an unfortunate consequence, approximately the full bias voltage is applied to the off transistor, resulting in a maximum possible leakage for the off transistor.

In contrast, in a stacked inverter multiple transistors are either on or off in series. For example, in the embodiment of FIG. 1, for a "high" state, two transistors are on, while two transistors are off. Consequently, each "off" transistor has significantly less than full bias voltage applied. It is appreciated that leakage current generally decreases exponentially as voltage decreases. For example, a factor of two reduction in off bias voltage produces about a factor of eight reduction in leakage current per leakage path.

It is to be further appreciated that such leakage induces non zero voltages at intermediate nodes between the off transistors. Such voltages induce body effects in the transistors. Such body effects increase the threshold voltage of the affected transistors. An increased threshold voltage generally produces beneficial decreases in leakage current.

Consequently, in addition to a decrease in a number of leakage paths, in accordance with embodiments, the leakage current of each path is very beneficially reduced due to an induced body effect and a highly non-linear relationship between bias voltage and leakage current. Thus; inverter 110 significantly reduces static power consumption, in comparison to a conventional inverter.

It is to be appreciated that more or fewer stacked FETs can be can be included in inverter 110 in order to achieve differing signal propagation and/or power characteristics, in accordance with embodiments.

For example, physical differences between electrons and holes, and between n-type and p-type dopants, as well as constructive differences in device geometry and dopant placement, result in differences in efficiency between n-type devices and p-type devices. Because electron mobility is higher than hole mobility, n-type devices are more efficient than p-type devices. However, the degree of difference depends on constructive differences that can vary with process. Such physical and constructive differences also produce other behavior differences, such as a difference in sensitivity to body effects. Consequently, different levels of benefit, e.g., in leakage reduction, are to be expected between stacks of n-type devices and stacks of p-type devices. To allow for such effects, in accordance with embodiments, it is possible to stack different numbers of transistors on either or both legs of a stacked inverter. Such variations allow increases in load and/or decreases in drive capability, enabling a wide variety of loading and drive characteristics, as well as enabling differing body effects.

Also of benefit in reducing power consumption, particularly static power consumption, of power efficient multiplexer 100 is transmission gate structure 120. It is to be appreciated that transmission gates, for example transmission gates 121 and 122, are characterized as having no direct path between power (Vdd) and ground. Consequently, transmission gates are characterized as having extremely small leakage, and thus very little static power consumption.

It is appreciated that a variety of factors, e.g., operating voltage, operating temperature and/or manufacturing process variations, can affect the speed of operation of an integrated circuit. It is generally desirable for a multiplexer to track speed changes of other circuitry of an integrated circuit. For example, if other circuits of an integrated circuit operate faster, generally a multiplexer is required to select a desired signal more quickly in order for the overall circuit to function. Because embodiments comprise stacked devices, they are similar to many logic circuits that also comprise stacked devices, e.g., NAND and/or NOR logic gates. Consequently, embodiments match or track changes in operating speed of complex logic more accurately than multiplexers comprising very simple inverters.

It is to be appreciated that embodiments are well suited to selecting among more than the two signals illustrated in FIG. 1, and embodiments comprising more than two selectable signals are to be considered within the scope of the disclosure.

Embodiments are thus shown to offer significant and highly beneficial improvements in tracking timing changes of other circuits and in static power (leakage current) consumption in comparison to the conventional art.

Figure 2:
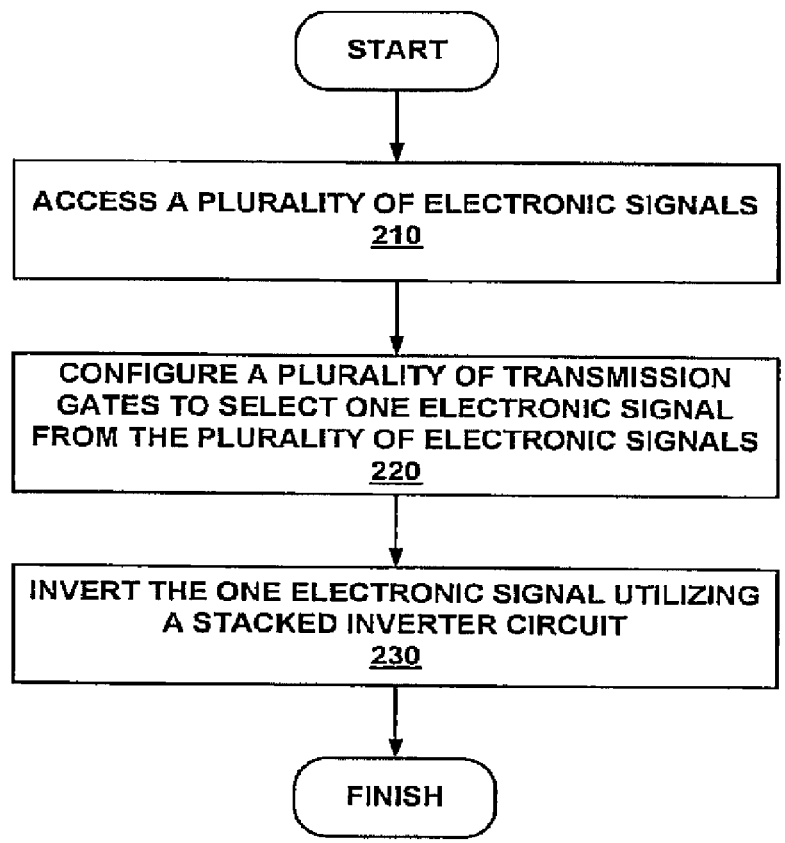
FIG. 2 illustrates a flow chart for a method 200 of selecting one electronic signal from a plurality of electronic signals, in accordance with embodiments.

FIG. 2 illustrates a flow chart for a method 200 of selecting one electronic signal from a plurality of electronic signals, in accordance with embodiments. In 210, the plurality of electronic signals is accessed. For example, referring to FIG. 1, the plurality of electronic signals is accessed at transmission gates 121 and 122.

In 220, a plurality of transmission gates is configured to select one electronic signal from the plurality of electronic signals. For example, referring to FIG. 1, a zero value in latch 130 will cause transmission gate 121 to pass signal A 125, while causing transmission gate 122 not to pass any signals. Consequently, transmission gate structure 120 will select signal A 125 corresponding to a zero value in latch 130.

In 230, the one electronic signal is inverted utilizing a stacked inverter circuit, for example stacked inverter circuit 110 of FIG. 1.

The foregoing descriptions of specific embodiments have been presented for purposes of illustration and description. They are not intended to be exhaustive or to limit the disclosure to the precise forms disclosed, and many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is intended that the scope of the disclosure be defined by the claims appended hereto and their equivalents.

What is claimed is:

1. A circuit comprising:
   means for outputting at least one bit and a complement of the at least one bit;
   means for selectively passing one of a plurality of input signals by using the at least one bit and the complement outputted by the means for outputting; and
   means for inverting the one of the plurality of input signals passed by the means for selectively passing, wherein the means for inverting is operable independently of the at least one bit and the complement and a state of a clock signal.

2. The circuit of claim 1, wherein the means for selectively passing comprises:
   a first transmission gate coupled to the means for inverting; and
   a second transmission gate coupled to the means for inverting.

3. The circuit of claim 1, wherein the means for inverting comprises:
   a first plurality of devices of a first doping type coupled in series; and
   a second plurality of devices of a second doping type coupled in series, wherein the first and the second pluralities of devices are coupled in series.

4. The circuit of claim 3, wherein the first plurality of devices comprises at least two p-type devices.

5. The circuit of claim 3, wherein the second plurality of devices comprises at least two n-type devices.

6. The circuit of claim 3, wherein the means for inverting is operable to track timing changes of other components more accurately than an inverter comprising two active devices.

7. The circuit of claim 3, wherein the means for inverting is operable to cause less leakage current than an inverter comprising two active devices.

8. The circuit of claim 3, wherein the first plurality of devices and the second plurality of devices include gate terminals, wherein the gate terminals are operable to receive the one of the plurality of input signals passed by the means for selectively passing.

9. A circuit comprising:
   means for outputting at least one bit and a complement of the at least one bit;
   means for inverting operable to invert independently of the at least one bit and the complement and a state of a clock signal;
   first means for passing a first input signal to the means for inverting; and
   second means for passing a second input signal to the means for inverting,
   wherein the first means for passing and the second means for passing are operable to pass one of the first input signal and the second input signal by using the at least one bit and the complement outputted by the means for outputting.

10. The circuit of claim 9, wherein the means for inverting comprises:
    at least two devices of a first doping type coupled in series; and
    at least two devices of a second doping type coupled in series and coupled in series to the at least two devices of the first doping type, wherein the at least two devices of the first doping type and the at least two devices of the second doping type include gate terminals, and wherein the gate terminals are coupled together.

11. The circuit of claim 10, wherein the at least two devices of the first doping type comprise:
    at least two p-type devices.

12. The circuit of claim 10, wherein the at least two devices of the second doping type comprise:
    at least two n-type devices.

13. The circuit of claim 9, wherein the first means for passing comprises:
    a first conductance terminal configured to receive the first input signal;
    a second conductance terminal coupled to an input of the means for inverting;
    a first control terminal of a first semiconductor type coupled to the at least one bit; and
    a second control terminal of a second semiconductor type coupled to the complement,
    wherein the second means for passing comprises:
    a third conductance terminal configured to receive the second input signal;
    a fourth conductance terminal coupled to the input of the means for inverting;
    a third control terminal of the second semiconductor type coupled to the at least one bit and coupled to the first control terminal; and
    a fourth control terminal of the first semiconductor type coupled to the complement and coupled to the second control terminal.

* * * * *

UNITED STATES PATENT AND TRADEMARK OFFICE
CERTIFICATE OF CORRECTION

PATENT NO.       : 8,587,344 B2
APPLICATION NO.  : 13/356396
DATED            : November 19, 2013
INVENTOR(S)      : Masleid It is certified that error appears in the above-identified patent and that said Letters Patent is hereby corrected as shown below:

On Title Page 2, Item (56), under "OTHER PUBLICATIONS", in Column 2, Line 2, delete "subquater" and insert -- subquarter --, therefor.

On Title Page 3, Item (56), under "OTHER PUBLICATIONS", in Column 1, Line 11, delete "IEE" and insert -- IEEE --, therefor.

In the Specification

In Column 2, Line 7, delete "circuit" and insert -- circuit. --, therefor.

In Column 2, Lines 7-25, delete "In accordance..............transmission gate." and insert -- In accordance with still another embodiment, an electronic circuit comprises a stacked inverter circuit. The stacked inverter circuit comprises at least two devices of a first type coupled in series. These devices are coupled in series to a group of at least two devices of an opposite type coupled in series. The electronic circuit further comprises a first conductance terminal of a first transmission gate coupled to a first electronic signal and a first conductance terminal of a second transmission gate coupled to a second electronic signal. The second conductance terminals of the first and second transmission gates are coupled to an input of the stacked inverter circuit. The first control terminal of a semiconductor type of the first transmission gate is coupled to a second control terminal of opposite semiconductor type of the second transmission gate. The second control terminal of the opposite semiconductor type of the first transmission gate is coupled to a first control terminal of the semiconductor type of the second transmission gate. --, therefor.

In Column 2, Line 62, delete "(MOSFETS))" and insert -- (MOSFETs)) --, therefor.

In Column 2, Line 63, delete "MOSFETS)" and insert -- MOSFETs) --, therefor.

In Column 2, Line 66, delete "MOSFETS)" and insert -- MOSFETs) --, therefor.

Signed and Sealed this
Twenty-ninth Day of April, 2014

Michelle K. Lee
*Deputy Director of the United States Patent and Trademark Office*

CERTIFICATE OF CORRECTION (continued)
U.S. Pat. No. 8,587,344 B2

In Columns 2 & 3, Lines 67 & 1, delete "p-type MOSFETS)" and insert -- p-type MOSFETs) --, therefor.

In Column 3, Lines 58-60, delete "As an.......transistor." and insert the same at Line 57, after "is off.", as a continuation paragraph.